(12) United States Patent
Hill

(10) Patent No.: US 7,604,534 B2
(45) Date of Patent: Oct. 20, 2009

(54) CIRCULATION AND EXTERNAL VENTING UNIT

(75) Inventor: Dennis Hill, Lower Hutt (NZ)

(73) Assignee: Rayhill Limited, Petone (NZ)

( * ) Notice: Subject to any disclaimer, the term of this patent is extended or adjusted under 35 U.S.C. 154(b) by 61 days.

(21) Appl. No.: 10/567,585

(22) PCT Filed: Aug. 4, 2004

(86) PCT No.: PCT/NZ2004/000173

§ 371 (c)(1), (2), (4) Date: Sep. 15, 2006

(87) PCT Pub. No.: WO2005/013659

PCT Pub. Date: Feb. 10, 2005

(65) Prior Publication Data

US 2007/0105493 A1    May 10, 2007

(30) Foreign Application Priority Data

Aug. 4, 2003    (NZ) .................................. 527368

(51) Int. Cl.
*H05K 7/20* (2006.01)
*H05K 5/00* (2006.01)
*G06F 1/20* (2006.01)

(52) U.S. Cl. ............. 454/184; 361/679.46; 361/679.48; 361/679.49; 361/695

(58) Field of Classification Search .................. 454/184; 361/692, 695, 679.46, 679.48, 679.49
See application file for complete search history.

(56) References Cited

U.S. PATENT DOCUMENTS

| | | | |
|---|---|---|---|
| 4,495,545 A | 1/1985 | Dufresne et al. | |
| 4,665,466 A * | 5/1987 | Green | 361/696 |
| 4,710,851 A * | 12/1987 | Pastecki | 361/687 |
| 4,735,258 A * | 4/1988 | Patarino | 165/300 |
| 4,835,983 A * | 6/1989 | Chandler et al. | 62/259.1 |
| 5,216,577 A * | 6/1993 | Schilling | 361/689 |
| 5,485,878 A | 1/1996 | Derks | |
| 5,773,755 A * | 6/1998 | Iwatare | 174/17 VA |
| 5,892,195 A * | 4/1999 | Aufermann et al. | 218/157 |
| 6,104,003 A | 8/2000 | Jones | |
| 6,105,878 A | 8/2000 | Robinson et al. | |
| 6,127,663 A | 10/2000 | Jones | |

(Continued)

FOREIGN PATENT DOCUMENTS

EP    0 860 923 A1    8/1998

(Continued)

*Primary Examiner*—Steven B McAllister
*Assistant Examiner*—Patrick F. O'Reilly, III
(74) *Attorney, Agent, or Firm*—Blakely, Sokoloff, Taylor & Zafman LLP

(57) ABSTRACT

An air circulation and ventilation unit is provided including a housing configured to fit at least partially over the ceiling of an equipment cabinet including fitting over at least one vent in the ceiling of the cabinet, so that the interior of the housing is in communication with the interior of the cabinet, the housing includes a housing vent moveable between an open position in which air may flow between the outside of the housing and the inside of the housing and a closed position in which little or no air can flow between the outside of the housing and the inside of the housing, and a controller to control the position of the housing vent.

12 Claims, 3 Drawing Sheets

U.S. PATENT DOCUMENTS

| | | | |
|---|---|---|---|
| 6,181,557 B1 | 1/2001 | Gatti | |
| 6,342,004 B1 * | 1/2002 | Lattimore et al. | 454/184 |
| 6,579,168 B1 | 6/2003 | Webster et al. | |
| 2003/0011988 A1 * | 1/2003 | Irmer | 361/690 |
| 2003/0107873 A1 | 6/2003 | Van Gaal | |

FOREIGN PATENT DOCUMENTS

| | | | |
|---|---|---|---|
| GB | 2202681 A * | 9/1988 | |
| GB | 2262190 A * | 6/1993 | |
| GB | 2 300 910 A | 11/1996 | |
| WO | WO 00/21372 | 4/2000 | |
| WO | WO 00/56134 | 9/2000 | |
| WO | WO 01/15507 | 3/2001 | |

* cited by examiner

CIRCULATION AND EXTERNAL VENTING UNIT

CROSS-REFERENCE TO OTHER APPLICATIONS

This is a National Phase of International Application No. PCT/NZ2004/000173, filed on Aug. 4, 2004, which claims priority from New Zealand Patent Application No. 527368, filed on Aug. 4, 2003.

FIELD OF INVENTION

The invention relates to ventilation and air circulation systems for equipment cabinets and in particular to thermostatically controlled air ventilation and circulation systems for equipment cabinets.

BACKGROUND

Electronic equipment for many functions is housed in cabinets. For example, such equipment may be equipment for airport runways, traffic lights, remote cellular sites, weather tracking sites and light houses. Equipment cabinets, in both central and remote locations must be maintained within a temperature range that allows the electronics inside the cabinet to function. If the temperature inside the cabinet becomes too high or too low the equipment may malfunction or cease to function altogether.

Some equipment is housed in cabinets in remote locations that may be difficult to access and maintain. Remote locations may also be in harsh environments and may be subject to temperature extremes. In these circumstances the equipment inside the cabinets must be protected from low temperatures as well as from high temperatures.

Current systems for providing ventilation for equipment cabinets may include a separate ventilation chamber attached to the cabinet. Air circulates in the ventilation chamber altering the air temperature inside the cabinet. A disadvantage of this system is that the cabinet does not experience any change in air.

SUMMARY OF INVENTION

It is the object of the present invention to provide a circulation and ventilation unit that overcomes or alleviates the above disadvantages or to at least provide a useful choice.

In broad terms the invention comprises an air circulation and ventilation unit including a housing configured to fit at least partially over the ceiling of an equipment cabinet including fitting over at least one vent in the ceiling of the cabinet, so that the interior of the housing is in communication with the interior of the cabinet, the housing including a housing vent moveable between an open position in which air may flow between the outside of the housing and the inside of the housing and a closed position in which little or no air can flow between the outside of the housing and the inside of the housing, and a controller to control the position of the housing vent.

Preferably the air circulation and ventilation unit further includes a temperature sensor on the inside of the cabinet attached to the controller that provides an indication of the temperature inside the cabinet.

Preferably the air circulation and ventilation unit further includes a fan inside the housing or the cabinet to circulate air.

Preferably the fan is controlled by the controller inside the air circulation and ventilation unit.

In some embodiments the air circulation and ventilation unit may include a heater inside the housing that is controlled by the temperature sensor inside the cabinet.

Preferably the controller includes a solenoid that controls the housing vent position.

Preferably the housing vent is spaced apart from the cabinet vent(s).

Preferably the housing vent rotates between open and closed positions.

BRIEF DESCRIPTION OF DRAWINGS

The invention will be further described by way of example only and without intending to be limiting with reference to the following drawings, wherein.

DETAILED DESCRIPTION

Figure 1:
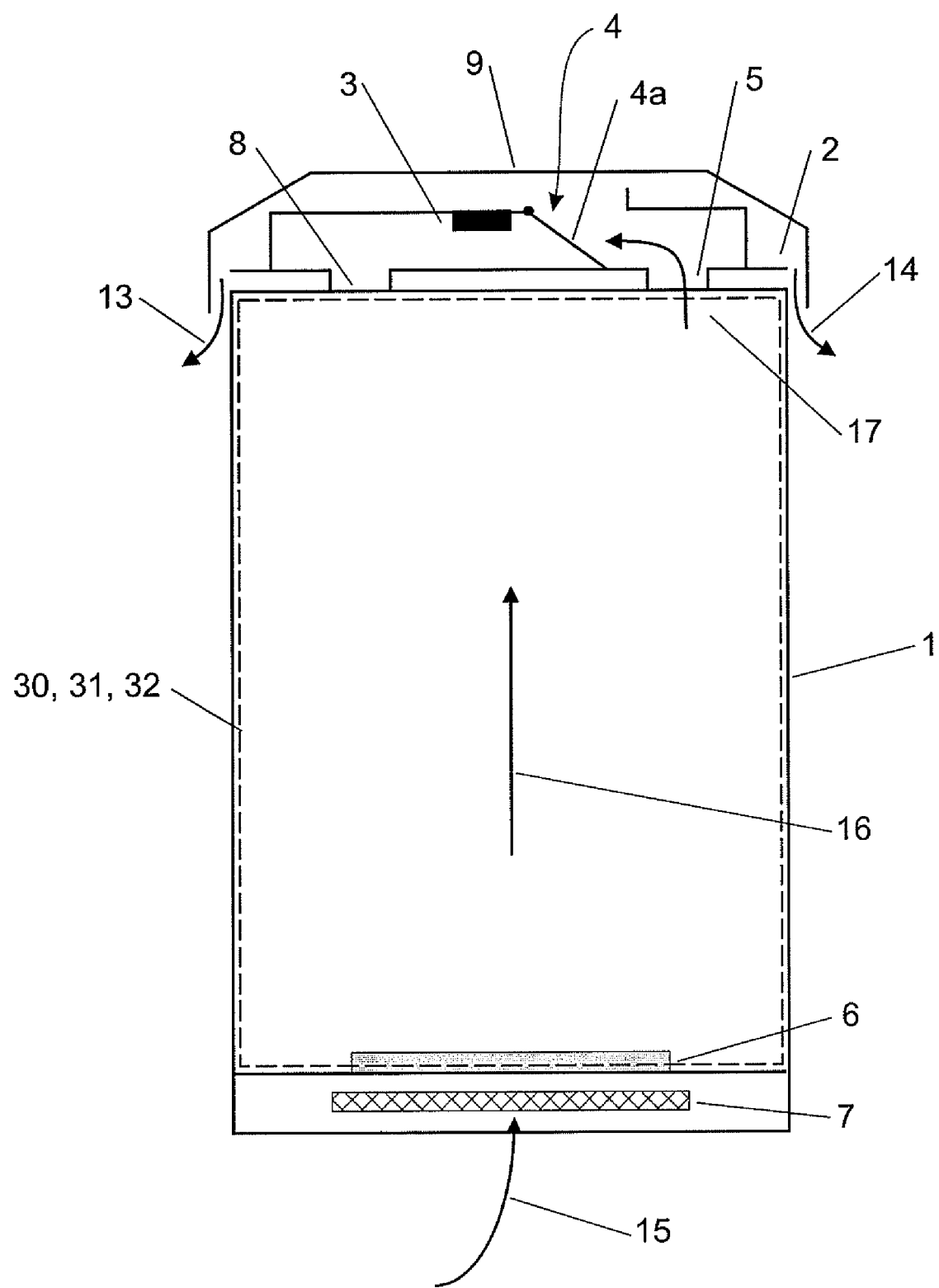
FIG. 1 shows a cabinet with an air circulation and ventilation unit of the invention with the vent in the open position.

FIG. 1 shows one embodiment of air circulation and ventilation unit 2 of the invention attached to a cabinet 1. Cabinet 1 has a lower vent and filter 6 and upper vents 5 and 8 (in the ceiling of the cabinet) through which air can circulate. The lower vent and filter 6 receives air through plinth vent 7. The plinth vent may form part of a separate piece that is attached to the bottom of the cabinet.

In general cabinet 1 will be insulated to retain some heat inside the cabinet and reduce the amount of noise that escapes from the cabinet.

Air circulation and ventilation unit 2 sits between the ceiling and roof of cabinet 1. The air circulation and ventilation unit includes at least one vent 4 and controller 3. Vent 4 can be rotated between an open position (shown in FIG. 1) and a closed position (shown in FIG. 2). Controller 3 controls the position of the vent. The interior of air circulation and ventilation unit 2 is in communication with the interior of the cabinet through vents 5 and 8.

Figure 2:
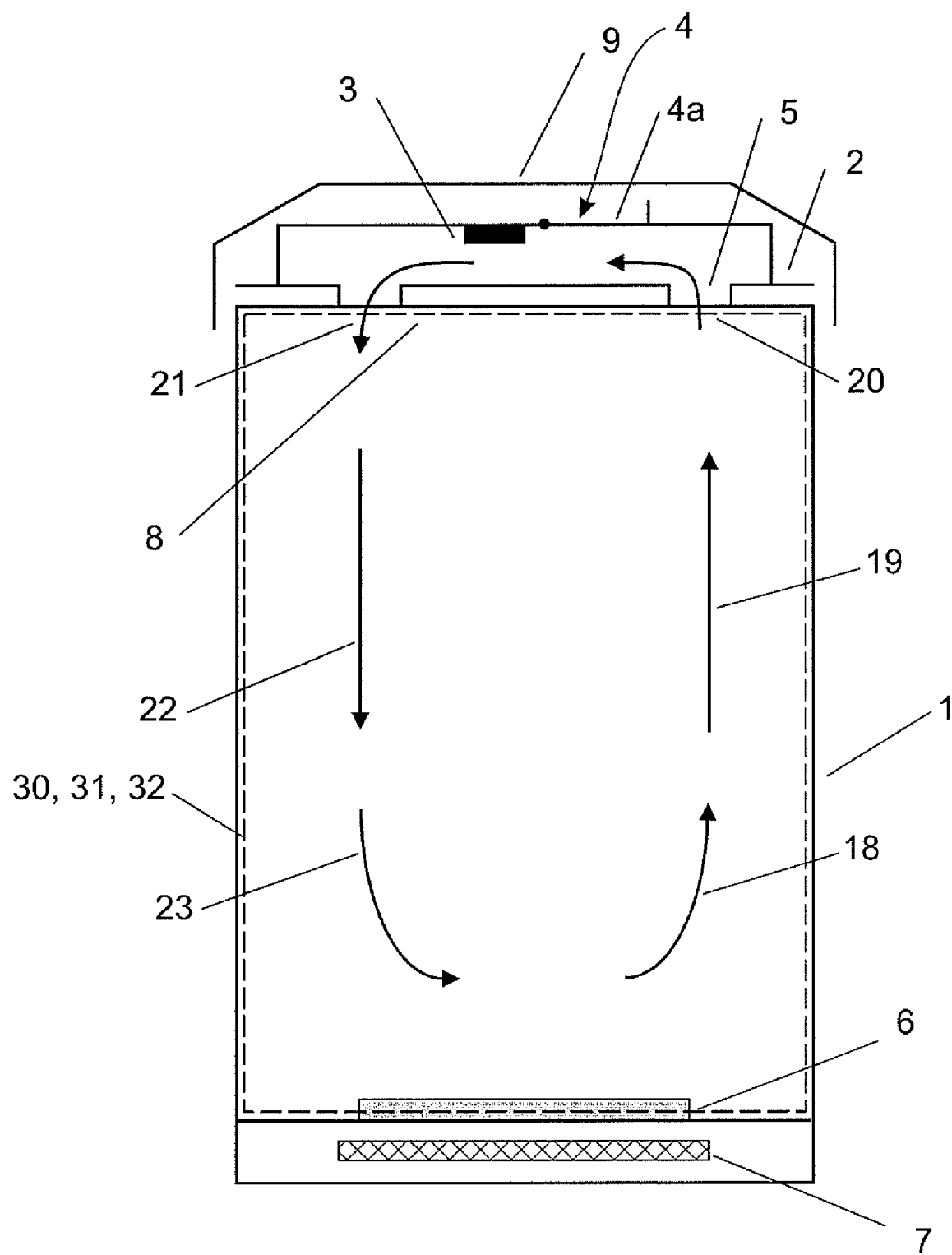
FIG. 2 shows a cabinet with an air circulation and ventilation unit of the invention with the vent in the closed position.

As can be seen in FIG. 1 vent 4 in the air circulation and ventilation unit is spaced apart from vents 5 and 8 in the ceiling of the cabinet. An external roof 9 protects the air circulation and ventilation unit and inside of the cabinet from rain, dust particles and the like while still maintaining a tamper proof cabinet and allowing ventilation. Although FIGS. 1 and 2 show a cabinet with two ceiling vents, the number, size and position of the ceiling vents in the cabinet may vary. The shape of roof 9 and the shape, number and position of the vents may also vary.

In preferred embodiments the air circulation and ventilation unit includes at least one temperature sensor 30. In a preferred embodiment the temperature sensor is positioned inside the cabinet. In an alternative embodiment a temperature sensor is positioned inside the air circulation and ventilation unit. The controller 3 receives an indication of when the temperature is outside a predetermined range as sensed by the temperature sensor 30. If the temperature falls outside the predetermined operating range the controller may operate the vent 4 to open or close the vent. For example if the internal temperature of the cabinet rises above the upper limit of the temperature range the temperature sensor 30 sends an indication to controller 3 and the controller opens vent 4 to allow air to circulate into the roof and to the outside of the cabinet as shown by arrows 13 and 14. Likewise if the temperature within the cabinet falls below the lower limit of the temperature range the temperature sensor 30 sends an indication to the controller 3 and the controller closes vent 4 to prevent air circulating within the cabinet from exiting the cabinet via the roof space. In one embodiment controller 3 is a solenoid, although any suitable controller may be used.

In one embodiment the air circulation and ventilation unit includes a fan 31 provided in the cabinet, under a vent, for example under vent 5. In an alternative embodiment the air circulation and ventilation unit may include a fan that may be positioned underneath air circulation and ventilation unit 2. The fan 31 may be controlled by a temperature sensor inside the cabinet to assist in air circulation.

If the cabinet and air circulation and ventilation unit is housed in an area that experiences very cold temperatures the air circulation and ventilation unit may include a heater 32 to heat the inside of the cabinet if the temperature inside the cabinet falls below a predetermined lower limit. In one embodiment the heater is controlled by a temperature sensor inside the cabinet.

As can be seen from the arrows in FIG. 1 when vent 4 is open air circulates from the bottom of the cabinet and out through the top and under the openings in roof 9 following arrows 15, 16, 17, 13, and 14. This allows air to circulate through the cabinet through the air circulation and ventilation unit 2 and out of the cabinet. This cools equipment in the cabinet if the temperature inside the cabinet is greater than that outside the cabinet.

FIG. 2 shows an air circulation and ventilation unit of the invention with the vent closed. When the vent is closed air circulates within the cabinet. As can be seen in FIG. 2 when vent 4 is closed little or no air can escape through vent 4 and into the roof space of the cabinet. The air inside the cabinet circulated between the interior of the cabinet 1 and the interior of housing 2 through vents 5 and 8 as shown by arrows 18, 19, 20, 21, 22, and 23. Fresh air may still enter the cabinet through lower vent and filter 6.

Controller 3 may respond to information from temperature sensor(s) and/or to an indication of the load on the components. For example if the component load is high the amount of heat generated by the components will be greater than when the component load is low so the vent may be opened during periods of high component load. In an alternative embodiment the controller may open and close the vent based on the time of day and the day of the year. This system has less flexibility to changing weather and component load conditions. Controller 3 may also respond to a condensation indication so as to reduce condensation within the cabinet. In one embodiment controller 3 is a thermostatically controlled solenoid. In an alternative embodiment controller 3 may include a microprocessor or the like and receive temperature indications from the temperature sensor(s). The controller may then open or close vent 4 in response to temperature or other indications. In this embodiment the controller may also control any fans or heaters and these can be controlled independently of the vent.

Figure 3:
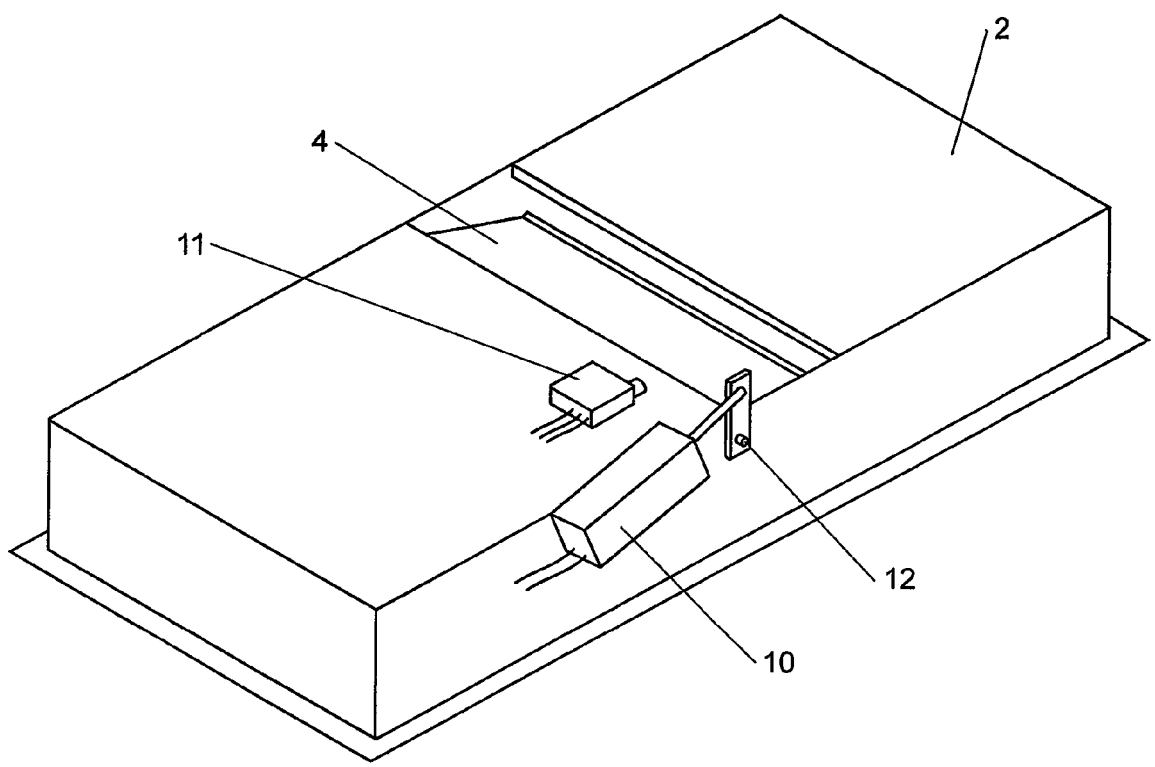
FIG. 3 shows an embodiment of the air circulation and ventilation unit of the invention.

FIG. 3 is a plan view of an air circulation and ventilation unit of the invention. The air circulation and ventilation unit includes housing 2, controller 10 and vent 4. The bottom of the housing unit (not shown) is open to allow communication between the inside of the air circulation and ventilation unit and the interior of the cabinet. Vent 4 provides a means of communication between the inside of the air circulation and ventilation unit (and therefore the interior of the cabinet) and the roof space of the cabinet when the vent is open. In this embodiment controller 10 is a solenoid that receives an indication from a temperature sensor (not shown) and in response opens or closes vent 4. In a preferred embodiment the temperature sensor is inside the equipment cabinet. Alternatively the temperature sensor can be housed inside the housing 2. In a further alternative embodiment a temperature sensor is housed outside the cabinet and housing to provide an indication of the outside air temperature.

As can be seen in FIG. 3 vent 4 rotates about an axle (not shown) through housing 2. Attached to the axis is metal strip 12 which forms a connection between the axle and the solenoid 10 allowing the solenoid to open and close the vent by rotating the vent axle. The vent also includes micro-switch 11 that provides an indication of whether the vent 4 is open or closed. Micro-switch 11 can be remotely monitored so that the opening and closing of vent 4 can be tracked. Micro-switch 11 can also be used to operate a fan inside the cabinet.

As an equipment protection mechanism in the event of a power failure the solenoid may be arranged to operate the vent to open the vent so that the equipment inside the cabinet does not over heat. In extreme cold environments the solenoid may be arranged to close the vent in the event of a power failure.

While vent 4 is shown as extending across housing 2 and being only a single vent more than one vent could be provided. The position and size of vent 4 may also be altered without departing from the scope of the invention.

The foregoing describes the invention including preferred forms thereof. Alterations and modifications as will be obvious to those skilled in the art are intended to be incorporated in the scope hereof as defined by the accompanying claims.

I claim:

1. An air circulation and ventilation unit comprising:
   a housing configured to fit at least partially over the ceiling of an equipment cabinet including fitting over at least two vents in the ceiling of the cabinet, so that at least a majority of the interior of the housing is in permanent communication with the interior of the cabinet so that air can always flow between the interior of the housing and the interior of the cabinet through the vents in the ceiling of the cabinet;
   the housing having a housing vent comprising a closure member moveable between an open position and a closed position, wherein in the closed position the closure member closes the housing vent so that little or no air is remitted to flow through the housing vent between the inside of the housing and the outside of the housing, and which enables air recirculation in which air is remitted to recirculate between the interior of the housing and the interior of the cabinet by flowing from the interior of the cabinet into the interior of the housing through one of the vents in the ceiling of the cabinet, then through the other of the vents in the ceiling of the cabinet from the interior of the housing into the interior of the cabinet, and wherein in the open position air is permitted to flow through the housing vent between the inside of the housing and the outside of the housing and in which said recirculation is substantially prevented by the closure member, the housing vent and housing vent closure member being positioned so that in both positions of the housing vent closure member air is able to flow between the interior of the housing and the interior of the cabinet; and
   a controller to control the position of the housing vent closure member.

2. An air circulation and ventilation unit as claimed in claim 1 further comprising a temperature sensor attached to the controller that provides an indication of the temperature inside the cabinet.

3. An air circulation and ventilation unit as claimed in claim 1 further comprising a fan inside the housing to circulate air.

4. An air circulation and ventilation unit as claimed in claim 3 wherein the fan is controlled by the controller.

5. An air circulation and ventilation unit as claimed in claim 1 further comprising a heater inside the housing that is controlled by the controller.

6. An air circulation and ventilation unit as claimed in claim 1 wherein the controller comprises a solenoid that controls the position of the housing vent closure member.

7. An air circulation and ventilation unit as claimed in claim 1 wherein the housing vent closure member rotates between the open and closed positions.

8. An air circulation and ventilation unit as claimed in claim 1 wherein the housing vent and closure member are provided in an external wall of the housing.

9. The combination of an air circulation and ventilation unit as claimed in claim 1, and an equipment cabinet having a ceiling, with the housing fitting over at least one vent in the ceiling of the cabinet, so that the interior of the housing is in communication with the interior of the cabinet.

10. A combination as claimed in claim 9 further comprising a roof over the circulation and ventilation unit.

11. A combination as claimed in claim 9 further comprising a fan inside the cabinet to circulate air.

12. A combination as claimed in claim 9 wherein the housing vent is offset from the cabinet vent(s).

* * * * *